United States Patent
Burton et al.

(10) Patent No.: US 10,736,156 B2
(45) Date of Patent: Aug. 4, 2020

(54) EXTENSION MOBILITY VIA A HEADSET CONNECTION

(71) Applicant: Plantronics, Inc., Santa Cruz, CA (US)

(72) Inventors: Joe Burton, Monte Sereno, CA (US); Cary Bran, Seattle, WA (US); Shantanu Sarkar, San Jose, CA (US); Philip Sherburne, Morgan Hill, CA (US)

(73) Assignee: Plantronics, Inc., Santa Cruz, CA (US)

( * ) Notice: Subject to any disclaimer, the term of this patent is extended or adjusted under 35 U.S.C. 154(b) by 0 days.

(21) Appl. No.: 15/705,150

(22) Filed: Sep. 14, 2017

(65) Prior Publication Data
US 2019/0082477 A1  Mar. 14, 2019

(51) Int. Cl.
| | |
|---|---|
| *H04M 1/00* | (2006.01) |
| *H04W 76/11* | (2018.01) |
| *H04W 4/02* | (2018.01) |
| *H04M 1/60* | (2006.01) |
| *H04W 4/80* | (2018.01) |
| *H04M 3/42* | (2006.01) |

(52) U.S. Cl.
CPC ......... *H04W 76/11* (2018.02); *H04M 1/6058* (2013.01); *H04M 1/6066* (2013.01); *H04M 3/42178* (2013.01); *H04W 4/023* (2013.01); *H04W 4/80* (2018.02); *H04M 2203/2094* (2013.01); *H04M 2250/02* (2013.01); *H04M 2250/04* (2013.01)

(58) Field of Classification Search
CPC ....... H04W 76/11; H04W 4/80; H04W 4/023; H04M 1/6066
See application file for complete search history.

(56) References Cited

U.S. PATENT DOCUMENTS

| | | | |
|---|---|---|---|
| 7,451,921 B2 | 11/2008 | Dowling et al. | |
| 8,644,473 B1 | 2/2014 | Bardwell et al. | |
| 2002/0111197 A1 | 8/2002 | Fitzgerald | |
| 2002/0115479 A1* | 8/2002 | Tischler | H04M 1/05 455/575.5 |

(Continued)

FOREIGN PATENT DOCUMENTS

WO  WO 2016/183712 A1  11/2016

OTHER PUBLICATIONS

Unknown, "No Ordinary Speakerphone Calisto 800 Series," Jan. 2011, 2 pages, found at URL <http://plantronics-pkb.force.com//servlet/fileField?retURL=%2Farticles%2Fen_US%2FDocumentation%2Fcalisto-800-data-sheet-us%3Fregion%3Dus%26p%3D%26c%3DAll%26k%3DCalisto%2B800%2BSeries%26t%3DAll%26lang%3Den_US&entityId=ka150000000Ck80AAC&field=Document_Body_s>.

(Continued)

*Primary Examiner* — Md K Talukder
(74) *Attorney, Agent, or Firm* — Jeremy S. DesRosier

(57) ABSTRACT

A method is disclosed for performing extension mobility via a headset connection. The method includes receiving a headset identifier from a headset. Also, the method includes, in response to receiving the headset identifier, sending the headset identifier to a device management server. Further, the method includes receiving a call control user identifier from the device management server, and sending, to a call control server, the call control user identifier. Still yet, the method includes receiving, from the call control server, a configuration profile associated with the call control user identifier. One or more settings of a desk phone are configured using the configuration profile.

14 Claims, 8 Drawing Sheets

(56) References Cited

U.S. PATENT DOCUMENTS

| | | | |
|---|---|---|---|
| 2009/0081999 A1* | 3/2009 | Khasawneh | H04M 3/56 |
| | | | 455/416 |
| 2010/0210212 A1* | 8/2010 | Sato | H04B 5/02 |
| | | | 455/41.3 |
| 2013/0104187 A1* | 4/2013 | Weidner | G06F 21/45 |
| | | | 726/1 |
| 2013/0259223 A1* | 10/2013 | Pedersen | H04M 1/6033 |
| | | | 379/428.02 |
| 2018/0077482 A1* | 3/2018 | Yuan | H04R 1/08 |
| 2018/0302507 A1* | 10/2018 | Johnson | H02J 7/00 |
| 2019/0281147 A1* | 9/2019 | Sherburne | H04M 1/215 |
| 2019/0289653 A1* | 9/2019 | Sarkar | H04W 12/08 |

OTHER PUBLICATIONS

Unknown, "Calisto™ Pro Series Home Phone with Multi-function Bluetooth® Headset User Guide," 2007, 60 pages, found at URL <http://plantronics-pkb.force.com//servlet/fileField?retURL=%2Farticles%2Fen_US%2FDocumentation%2FCalisto-Pro-User-Guide-US%3Fregion%3Dus%26p%3D%26c%3DAll%26k%3D%26t%3D%26lang%3Den_US&entityId=ka150000000Ck6xAAC&field=Document_Body_s>.

International Search Report and Written Opinion issued in international application No. PCT/US2018/050944, dated Nov. 30, 2018 (12 pages).

\* cited by examiner

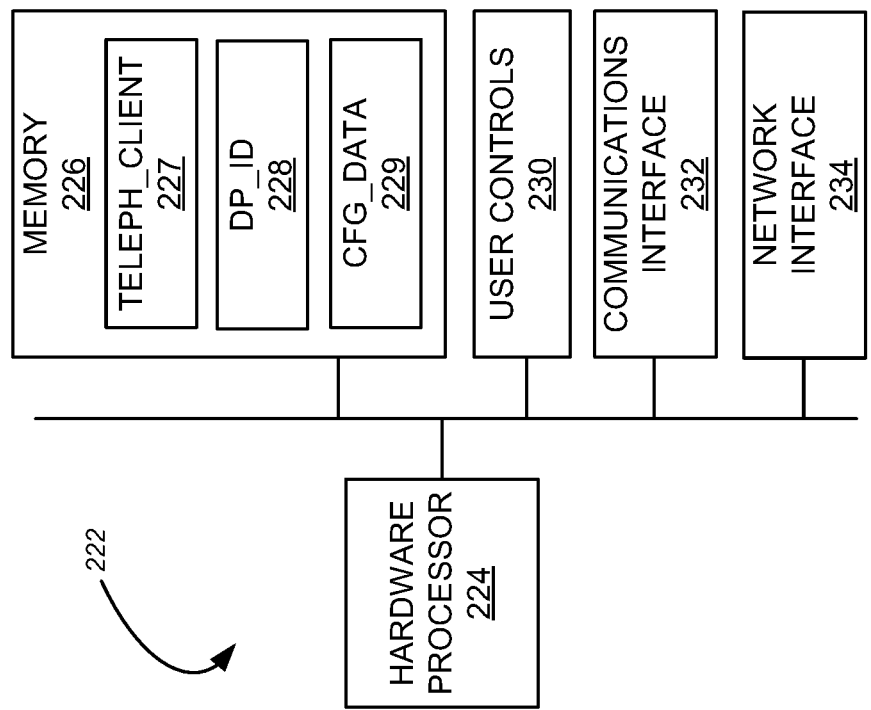
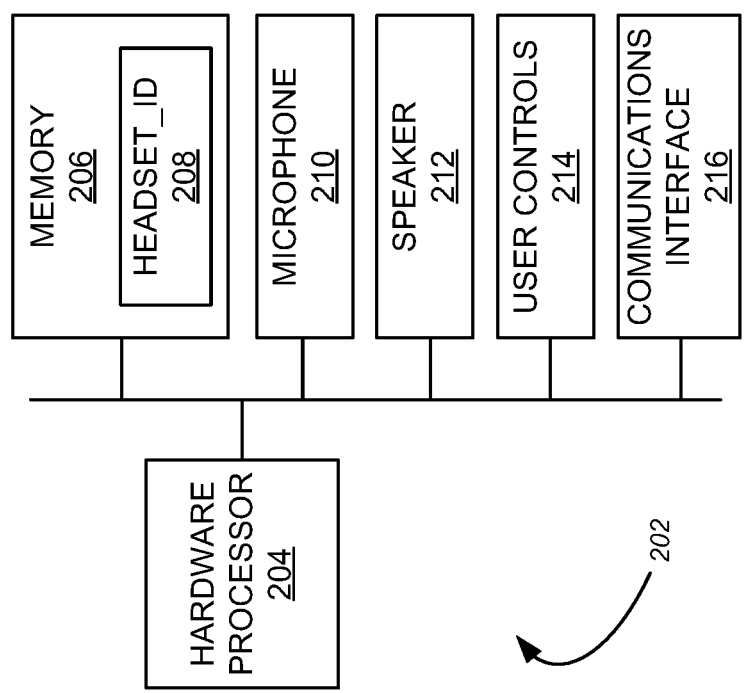
FIG. 2B
FIG. 2A

EXTENSION MOBILITY VIA A HEADSET CONNECTION

FIELD

The present disclosure relates generally to the field of telecommunications. More particularly, the present disclosure relates to the configuration of desk-based telephony hardware.

BACKGROUND

This background section is provided for the purpose of generally describing the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In current voice over IP (VoIP) telephone systems, a feature set known as "extension mobility" allows an IP voice endpoint to be used in a hoteling environment. In such installations, a given IP voice endpoint assumes a user's extension once the user authenticates with an IP-based private branch exchange (PBX) using the IP voice endpoint. In current systems, user authentication requires the user to enter his/her extension into the endpoint, and then provide a personal identification number (PIN). Once the user has established their identity, the IP voice endpoint works with the IP PBX to configure the IP voice endpoint according to the user's preferences. This may include the user's extension, speed dial preferences, secondary line instance, and voice mailbox, etc. Once the configuration has been pulled down to the voice endpoint, it becomes the user's phone until the user signs out.

SUMMARY

In general, in one aspect, the invention relates to a computer-readable media for performing extension mobility via a headset connection. The computer-readable media embodies instructions executable by a processor to perform functions including receiving a headset identifier from a headset, and, in response to receiving the headset identifier, sending a first message including the headset identifier to a device management server. Also, the computer-readable media embodies instructions executable by the processor to perform functions including receiving a call control user identifier from the device management server, and sending, to a call control server, a second message including the call control user identifier. Further, the computer-readable media embodies instructions executable by the processor to perform functions including receiving, from the call control server, a configuration profile associated with the call control user identifier, and configuring one or more settings of a desk phone based on the configuration profile.

In general, in one aspect, the invention relates to a computer-readable media for performing extension mobility via a headset connection. The computer-readable media embodies instructions executable by a processor to perform functions including receiving a headset identifier from a headset, and, in response to receiving the headset identifier, sending a message including the headset identifier to a device management server. Also, the computer-readable media embodies instructions executable by the processor to perform functions including receiving a configuration profile associated with the headset identifier, and configuring one or more settings of a desk phone based on the configuration profile.

In general, in one aspect, the invention relates to a computer-readable media for performing extension mobility via a headset connection. The computer-readable media embodies instructions executable by a processor to perform functions including receiving a headset identifier from a desk phone, and, in response to receiving the headset identifier, utilizing the headset identifier to identify a device mapping in a device registry. Also, the computer-readable media embodies instructions executable by the processor to perform functions including identifying a call control mapping in a call control registry based on the device mapping, and extracting a call control user identifier from the identified call control mapping. Further, the computer-readable media embodies instructions executable by the processor to perform functions including returning the call control user identifier to the desk phone.

The details of one or more implementations are set forth in the accompanying drawings and the description below. Other features will be apparent from the description and drawings, and from the claims.

DESCRIPTION OF DRAWINGS

FIGS. 2A-2C are block diagrams depicting devices for performing extension mobility via a headset connection, in accordance with one or more embodiments of the invention.

DETAILED DESCRIPTION

Figure 1A:
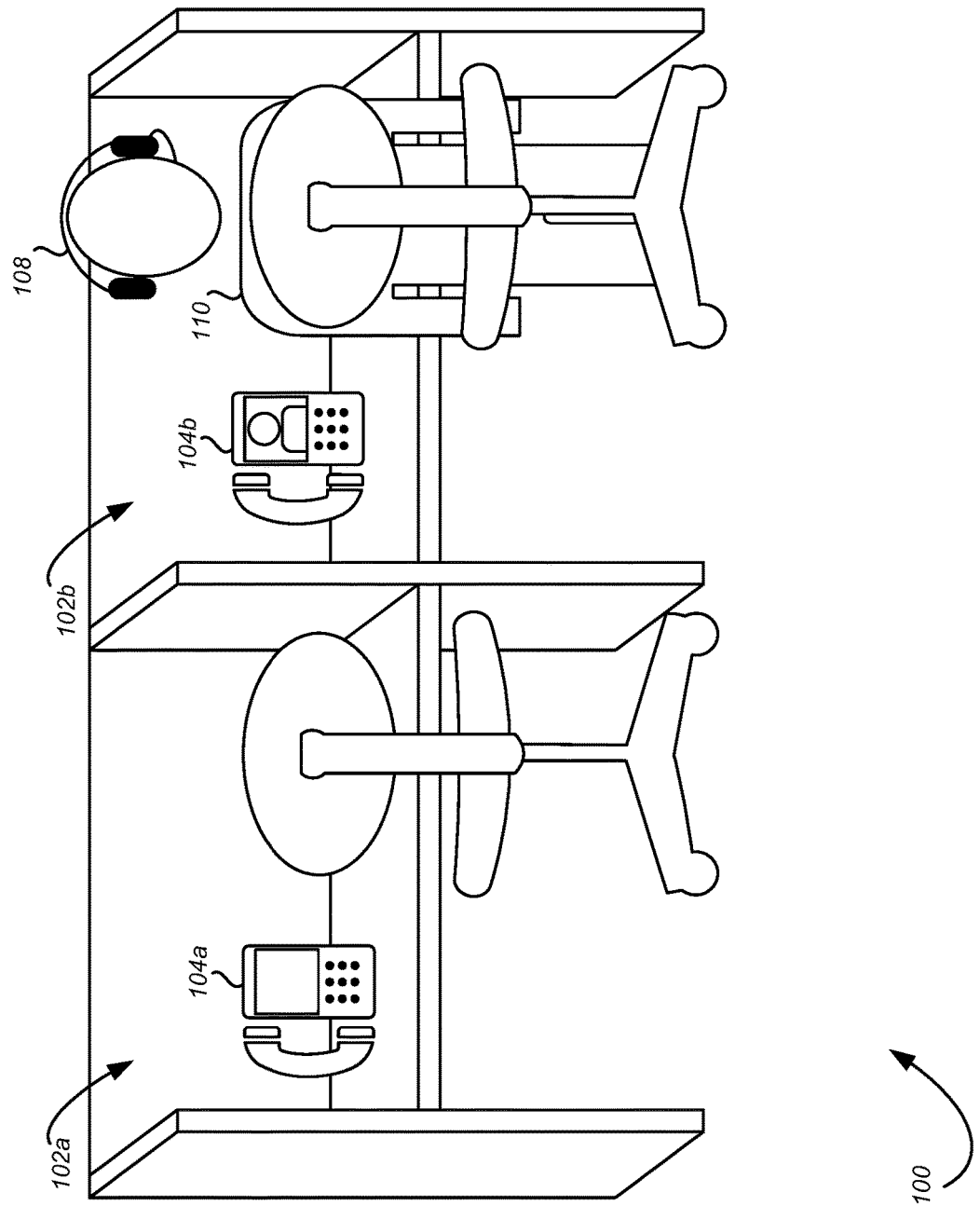
FIG. 1A depicts an environment for extension mobility via a headset connection, in accordance with one or more embodiments of the invention.

Specific embodiments of the invention are here described in detail, below. In the following description of embodiments of the invention, the specific details are described in order to provide a thorough understanding of the invention. However, it will be apparent to one of ordinary skill in the art that the invention may be practiced without these specific details. In other instances, well-known features have not been described in detail to avoid unnecessarily complicating the instant description.

In the following description, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between like-named the elements. For example, a first element is distinct from a second element, and the first element may encompass more than one element and succeed (or precede) the second element in an ordering of elements.

Current implementations of extension mobility rely on a protracted user authentication scheme that is prone to user error. In particular, such systems may require a user to first find and select the extension mobility feature within a nested menu structure on a desk phone, or enter a specific dial code (e.g., *57, *62, etc.). Menu structures may vary between desk-phones, which is frustrating to employees that move between desks with varied hardware. Moreover, dial codes are easily forgotten, and may vary between installations. After selecting the extension mobility feature, the system may prompt the user to enter a PIN code. Consequently, current implementations of extension mobility are generally prone to error and delay, and a frustrated user may entirely forego the login process, which may result in missed calls and missed opportunities.

In general, embodiments of the invention provide a system, a method, and a computer readable medium for extension mobility via a headset connection. Extension mobility is essential for office environments that leverage hoteling or hot desking, especially as employees increasingly work from home, or are not assigned a permanent desk or office. The systems and methods disclosed herein extend extension mobility in a manner that enables a user to quickly and effortlessly establish his or her identity within a call control system. In particular, the systems and methods disclosed herein leverage a registry that associates a user with one or more headset devices, and, upon presentation of a registered headset to a suitable desk phone, automate, at least in part, the extension mobility registration process. As a result, extension mobility registration is streamlined for headset users, and such users can begin immediately making and taking calls using their familiar headset hardware. For users that frequently travel between offices, the streamlined registration process may save significant time and frustration.

FIG. 1A shows an environment implementing extension mobility via a headset connection, according to one or more embodiments. Although the elements of the environment 100 are presented in one arrangement, other embodiments may feature other arrangements, and other configurations may be used without departing from the scope of the invention. For example, various elements may be combined to create a single element. As another example, the functionality performed by a single element may be performed by two or more elements. In one or more embodiments of the invention, one or more of the elements shown in FIG. 1A may be omitted, repeated, and/or substituted. Accordingly, various embodiments may lack one or more of the features shown. For this reason, embodiments of the invention should not be considered limited to the specific arrangements of elements shown in FIG. 1A.

As depicted in FIG. 1A, the environment 100 includes one or more unassigned workstations 102, each of which include a desk phone 104. For example, a first unassigned workstation 102a includes a first desk phone 104a, and a second unassigned workstation 102b includes a second desk phone 104b. As used herein, an unassigned workstation 102 includes any workspace to which a worker has not been permanently assigned. An unassigned workstation 102 may include, for example, a desk, a cubicle, a conference room, and/or an office. In one or more embodiments, one or more of the unassigned workstations 102 may be used in a hoteling environment, in which workers can schedule use of an unassigned workstation 102 by way of a reservation system. In one or more embodiments, one or more of the unassigned workstations 102 may be used in a hot desking environment, in which workers dynamically seat themselves, without reservations. For example, environment 100 may include a designated hoteling or hot desking area on a corporate campus. In this way, the environment 100 may be used by workers that infrequently work from the corporate campus, such as salespersons or other primarily remote workers.

As described herein, a desk phone 104 includes any hardware device having dial pad or equivalent, which may be used to make outgoing telephone calls and/or receive incoming telephone calls, that is tethered to a central call control system. Also, the desk phone 104 includes logic for registering to a PBX (e.g., a VoIP PBX, etc.), and logic to directly communicate with a headset 108. In one or more embodiments, a desk phone 104 may include a VoIP desk phone, which sends and receives voice communications over an Internet Protocol (IP) network, also referred to herein as VoIP communications.

As shown in FIG. 1A, a user 110 is presently utilizing the second unassigned workstation 102b. The user 110 may be, for example, an employee or worker that is temporarily working in the environment 100. The second desk phone 104b includes a mechanism to connect directly to the headset 108. The direct connection between the second desk phone 104b and the headset 108 may include any suitable communicative coupling, whether a direct physical connection or a wireless radio connection. As an option, one or more of the desk phones 104 may not include a handset. For example, a given desk phone 104 may include speakerphone functionality without an attached handset, or the desk phone 104 may lack both a handset and speakerphone functionality, such that a headset is required to carry on telephone calls using the desk phone 104. Of course, a given desk phone 104 may include each of a speakerphone, a handset, and headset connectivity.

The user 110 has authenticated himself or herself to the second desk phone 104b of the second unassigned workstation 102b. Specifically, and as described in further detail below, the user 110 has connected the headset 108 to the second desk phone 104b, and, in turn, the second desk phone 104b has automatically configured itself in accordance with a configuration profile of the user 110. The configuration profile may have been previously set by the user 110. Thereafter, any incoming calls to an extension of the user 110 may be routed to the second desk phone 104b. Also, the user 110 may easily access his or her speed dials and voicemails at the second desk phone 104b by operating user controls on the second desk phone 104b in a manner that is familiar to the user 110.

Additionally, upon connecting the headset 108 to the second desk phone 104b, any audio from the second desk phone 104b, such as call audio, may be routed to and from the headset 108. Accordingly, the user 110 may use the headset 108 to carry on telephone conversations, listen to voicemails, etc. at the second desk phone 104b. In one or more embodiments, once the user 110 communicatively couples his or her headset 108 to the second desk phone 104b, an extension of the user 110 is immediately attached to the desk phone 104b. Accordingly, the user 110 may begin initiating and receiving telephones calls at the second desk phone 104b, without needing to navigate menus or enter any dial codes. Moreover, as described below, the communicative coupling between the headset 108 and the second desk phone 104b may require no more than a momentary exchange of information between the two devices, such that the user 110 may begin using the second desk phone 104b as his or her phone immediately upon arriving at the second unassigned workstation 102b.

Figure 1B:
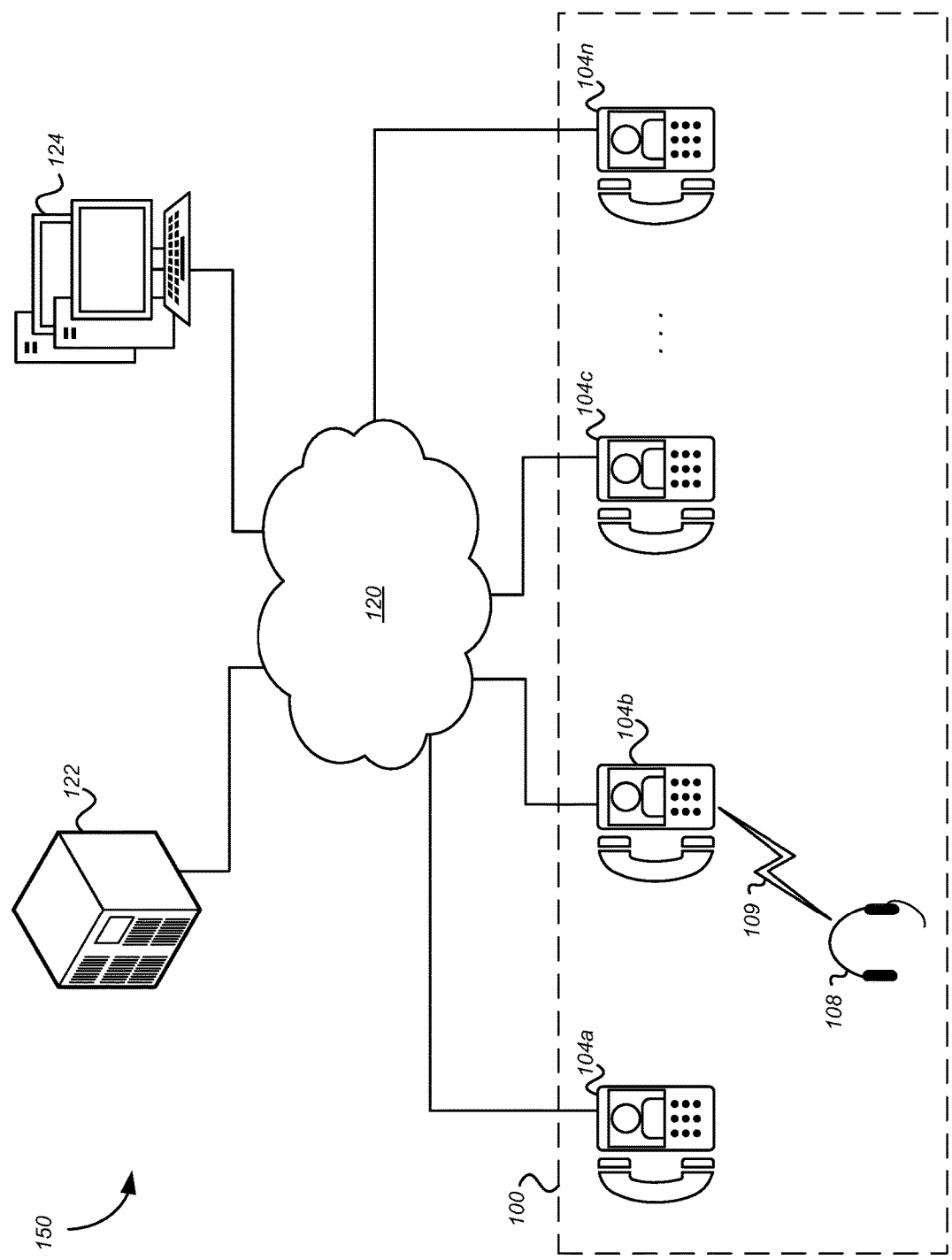
FIG. 1B depicts a system for extension mobility via a headset connection, in accordance with one or more embodiments of the invention.

FIG. 1B shows a system 150 for implementing extension mobility via a headset connection, according to one or more embodiments. Although the elements of the system 150 are presented in one arrangement, other embodiments may feature other arrangements, and other configurations may be used without departing from the scope of the invention. For example, various elements may be combined to create a single element. As another example, the functionality performed by a single element may be performed by two or more elements. In one or more embodiments of the invention, one or more of the elements shown in FIG. 1B may be omitted, repeated, and/or substituted. Accordingly, various embodiments may lack one or more of the features shown. For this reason, embodiments of the invention should not be considered limited to the specific arrangements of elements shown in FIG. 1B.

As depicted in FIG. 1B, the system 150 includes one or more desk phones 104 deployed in the environment 100 described above in reference to FIG. 1A. Also, the system 150 includes a network 120, a call control server 122, and a device management server 124. Each of the call control server 122, the device management server 124, and the desk phones 104 are communicatively coupled to the network 120. As described herein, the network 120 includes any private and/or public communications network, wired and/or wireless, such as a local area network (LAN), wide area network (WAN), and/or the Internet. The network 120 may support standards such as Ethernet, wireless fidelity (Wi-Fi), etc., and may be used by one or more of the call control server 122, the device management server 124, and the desk phones 104 for communicating with the other devices coupled to the network 120.

As described herein, the device management server 124 includes one or more remote computing devices that are accessible to the desk phones 104 over the network 120, and which maintain a registry associating users and headsets.

As described herein, the call control server 122 includes one or more remote computing devices that are accessible to the desk phones 104 over the network 120, and which monitor and manage voice communications that are destined for and received from the desk phones 104. For example, the call control server 122 may monitor the status of the desk phones 104, establish connections to/from the desk phones 104, modify parameters of connections at one or more of the desk phones 104, terminate connections at the desk phones 104, and/or restart failed connections at the desk phones 104. The call control server 122 may include, for example, a session initiation protocol (SIP) server, a Real-time Transport Protocol (RTP) server, and/or a Real-time Transport Control Protocol (RTCP) server. In one or more embodiments, the call control server 122 may include an IP PBX.

In one or more embodiments, the device management server 124 may be directly and/or securely connected to the call control server 122. The call control server 122 may include an Application Program Interface (API) that supports extension mobility. Each of the desk phones 104 may be provisioned to support extension mobility. Also, each of the desk phones 104 may be registered to the call control server 122, and/or be managed by the call control server 122.

Each of the desk phones 104 can read a unique identifier from a connected headset. As depicted in FIG. 1B, the second desk phone 104b has obtained, over a communications link 109, a unique identifier (i.e., headset identifier) from the headset 108. The communications link 109 may include a physical coupling between the headset 108 and the second desk phone 104b, and/or a wireless coupling between the headset 108 and the second desk phone 104b, as described below. Upon receiving the unique identifier from the headset 108, the second desk phone 104b may communicate with the device management server 124 to identify an extension. Moreover, upon identifying the extension, the second desk phone 104b may communicate with the call control server 122 to associate the second desk phone 104b with the extension, and to configure the second desk phone 104b in a manner that comports with the expectations of a user that presented the headset 108. This process is described in more detail below. In this way, each of the desk phones 104 (i.e., desk phones 104a-104n) remain readily available for use by users that may be temporarily working within the environment 100 and would like for their extension to be assigned to a device in the environment 100. Further, the owner of the headset 108 may transfer his or her extension to any one of the desk phones 104 (i.e., desk phones 104a-104n) by simply approaching a particular desk phone 104, and connecting his or her headset 108 to the chosen desk phone 104.

The headset 108 may include any body-worn device configured to include, when worn, a speaker proximate to an ear of a wearing user, and a microphone for monitoring the speech of the user. Accordingly, the headset 108 may include a monaural headset or stereo headset, whether worn by a user over-the-ear (e.g., circumaural headphones, etc.), in-ear (e.g., earbuds, earphones, etc.), or on-ear (e.g., supraaural headphones, etc.). The headset 108 may be utilized by the user to participate in telephone calls made from and received at the second desk phone 104b, or via another device.

In one or more embodiments, the communications link 109 between the second desk phone 104b and the headset 108 may include a physical connection. For example, the communications link 109 may include a Universal Serial Bus (USB) connection between the headset 108 and the second desk phone 104b. As another example, the communications link 109 may include docking the headset 108 in the second desk phone 104b, such that electrical contacts of the headset 108 and the second desk phone 104b are physically aligned and in direct electronic communication.

In one or more embodiments, the communications link 109 between the second desk phone 104b and the headset 108 may include a wireless connection. For example, the communications link 109 may include a Wi-Fi, a Bluetooth, a Digital Enhanced Cordless Telecommunications (DECT), or a ZigBee connection. As another example, the communications link 109 may include a near-field communication (NFC) connection. In such an example, the communications link 109 may be formed by tapping the headset 108 against the second desk phone 104b, or by otherwise placing the two devices in close proximity.

In one or more embodiments, the second desk phone 104b may exchange audio with the headset 108 via the communications link 109. For example, via the communications link 109, the headset 108 may receive call audio from the second desk phone 104b, and transmit speech to the second desk phone 104b when spoken by the user during a phone call. Further, via the communications link 109, the headset 108 may send messages to the second desk phone 104b, as well as receive messages from the second desk phone 104b. The messages may be sent by the second desk phone 104b and/or the headset 108 based on interactions of the user with controls of the second desk phone 104b and/or the headset 108. Such controls may include physical controls (e.g., buttons, dials, switches, keys, etc.) as well as controls in a software-based user interface.

Although the call control server 122 and the device management server 124 are depicted as two separate entities in FIG. 1B, it is understood that the functionality of the call control server 122 and the device management server 124 may be merged, such that call control and the headset registry are co-located. Further, although all of the desk phones 104a-104n are shown to occupy the environment 100, it is understood that the desk phones 104a-104n may span multiple physical environments. For example, the desk phones 104a-104n may be installed in different rooms on the same campus, or across different campuses of a single business organization, regardless of the physical proximity of such campuses to each other. In this way, an enterprise may rely on the systems and methods described herein to streamline the process used by its mobile workers when hot desking or hoteling anywhere on their network(s).

FIG. 2A shows a block diagram of a headset 202 for extension mobility via a headset connection, according to one embodiment. Although the elements of the headset 202 are presented in one arrangement, other embodiments may feature other arrangements, and other configurations may be used without departing from the scope of the invention. For example, various elements may be combined to create a single element. As another example, the functionality performed by a single element may be performed by two or more elements. In one or more embodiments of the invention, one or more of the elements shown in FIG. 2A may be omitted, repeated, and/or substituted. Accordingly, various embodiments may lack one or more of the features shown. For this reason, embodiments of the invention should not be considered limited to the specific arrangements of elements shown in FIG. 2A.

As shown in FIG. 2A, the headset 202 includes a hardware processor 204 operably coupled to a memory 206, a microphone 210, a speaker 212, one or more user controls 214, and a communications interface 216. In one or more embodiments, the hardware processor 204, the memory 206, the microphone 210, the speaker 212, the user controls 214, and the communications interface 216 may remain in communication over one or more communications busses. The headset 202 may be substantially identical to the headset 108, described in the context of FIGS. 1A and 1B, above.

As described herein, the communications interface 216 includes any interface for transmitting information to and receiving information from a desk phone. In one or more embodiments, the communications interface 216 includes a Universal Serial Bus (USB) transceiver or USB microcontroller. In one or more embodiments, the communications interface 216 includes a wireless transceiver and antenna coupled to the wireless transceiver, where the antenna converts electric power into radio waves under the control of the wireless transceiver, and intercepts radio waves which it converts to electric power and provides to the wireless transceiver. Accordingly, by way of the wireless transceiver and the antenna, the headset 202 may form a wireless link with a desk phone or other host device (e.g., personal computer, mobile phone, smartphone, etc.). The wireless transceiver may be, for example, a DECT transceiver, Bluetooth transceiver, or IEEE 802.11 (Wi-Fi) transceiver.

The user controls 214 include any mechanism of the headset 202, mechanical and/or electronic, that responds to user operation. The user controls 214 may include one or more of a button, a switch, a capacitive sensor, a touch screen, etc. The hardware processor 204 may control the transmission of messages to a desk phone, via the communications interface 216, in response to user operation (e.g., button presses, switches, etc.) of the user controls 214.

The microphone 210 includes any device that transforms received sound waves into a detectable electric current. The speaker 212 includes any device that transforms an electric current into sounds heard by a user of the headset 202.

As described herein, the memory 206 includes any storage device capable of storing information temporarily or permanently. The memory 206 may include volatile and/or non-volatile memory, and may include more than one type of memory. For example, the memory 206 may include one or more of SDRAM, ROM, and flash memory. In one or more embodiments, the memory 206 may store pairing information for connecting with a host device (e.g., a desk phone, mobile phone, smart phone, etc.), user preferences, and/or an operating system (OS) of the headset 202.

As depicted in FIG. 2A, the memory 206 stores a headset identifier 208. The headset identifier 208 includes any unique value stored to the headset 202 which may be used to differentiate the headset 202 from other headsets, including headsets of the same make and/or model. In one or more embodiments, the headset identifier 208 may include a serial number of the headset 202. In one or more embodiments, the headset identifier 208 may include a media access control (MAC) address of the headset 202. In one or more embodiments, the headset identifier 208 may include a USB unique device identifier of the headset 202. In one or more embodiments, the headset identifier 208 may include a Bluetooth address (BD_ADDR) of the headset 202. To this end, the headset identifier 208 may include any unique software readable device identifier that has been assigned to the headset 202. As an option, the headset identifier 208 may be stored to a read-only area of the memory 206.

As described herein, the hardware processor 204 processes data, including the execution of applications stored in the memory 206. In one or more embodiments, the hardware processor 204 may transmit information, via the communications interface 216, to a desk phone. For example, the headset 202 may send the headset identifier 208 to a desk phone via the communications interface 216. Such information may be transmitted to the desk phone, for example, when establishing a communications link with the desk phone, or when a phone call is active at the desk phone and call audio is being transmitted to/from the headset 202.

In one or more embodiments, the hardware processor 204 is a high performance, highly integrated, and highly flexible system-on-chip (SOC), including signal processing functionality such as echo cancellation/reduction and gain control in another example. In one or more embodiments, the hardware processor 204 may include a variety of processors (e.g., digital signal processors, etc.), analog-to-digital converters, digital-to-analog converters, etc., with conventional CPUs being applicable.

FIG. 2B shows a block diagram of a desk phone 222 for extension mobility via a headset connection, according to one embodiment. Although the elements of the desk phone 222 are presented in one arrangement, other embodiments may feature other arrangements, and other configurations may be used without departing from the scope of the invention. For example, various elements may be combined to create a single element. As another example, the functionality performed by a single element may be performed by two or more elements. In one or more embodiments of the invention, one or more of the elements shown in FIG. 2B may be omitted, repeated, and/or substituted. Accordingly, various embodiments may lack one or more of the features shown. For this reason, embodiments of the invention should not be considered limited to the specific arrangements of elements shown in FIG. 2B.

As shown in FIG. 2B, the desk phone 222 includes a hardware processor 224 operably coupled to a memory 226, a communications interface 232, one or more user controls 230, and a network interface 234. In one or more embodiments, the hardware processor 224, the memory 226, the user controls 230, the communications interface 232, and the network interface 234 may remain in communication over one or more communications busses. Although not depicted in FIG. 2B for purposes of simplicity and clarity, it is understood that, in one or more embodiments, the desk phone 222 may include an output device, such as a display (e.g., a liquid crystal display, a touch screen, etc.). The desk phone 222 may be substantially identical to the desk phone 104 described in the context of FIGS. 1A and 1B, above.

As described herein, the hardware processor 224 processes data, including the execution of applications stored in the memory 226. In one or more embodiments, the hardware processor 224 may include a variety of processors (e.g., digital signal processors, etc.), analog-to-digital converters, digital-to-analog converters, etc., with conventional CPUs being applicable.

The communications interface 232 includes any interface for transmitting information to and receiving information from a headset. In one or more embodiments, information received from a headset includes a headset identifier. For example, the desk phone 222 may receive the headset identifier 208 from the headset 202, described above, via the communications interface 232. In one or more embodiments, the desk phone 222 may receive a first audio signal from a headset via the communications interface 232 (e.g., audio picked up by the microphone 210 of the headset 202, etc.), and transmit a second audio signal to the headset via the communications interface 232 (e.g., audio to be played by the speaker 212 of the headset 202, etc.). In one or more embodiments, the communications interface 232 includes a Universal Serial Bus (USB) transceiver or USB microcontroller. In one or more embodiments, the communications interface 232 includes a wireless transceiver and antenna coupled to the wireless transceiver. Accordingly, by way of the wireless transceiver and the antenna, the desk phone 222 may form a wireless link with a headset. The wireless transceiver may be, for example, a DECT transceiver, Bluetooth transceiver, or IEEE 802.11 (Wi-Fi) transceiver.

As described herein, the network interface 234 communicates, using digital and/or analog signals, with one or more other devices over a network, such as the network 120 described in reference to FIG. 1B, above. Accordingly, the network interface 234 provides a pathway for the desk phone 222 to send and receive data, including VoIP communications. In other words, the network interface 234 may provide network connectivity to the desk phone 222, such that the desk phone 222 may server as a VoIP endpoint. The network interface 234 may include a wired or wireless network interface.

As described herein, the memory 226 includes any storage device capable of storing information temporarily or permanently. The memory 226 may include volatile and/or non-volatile memory, and may include more than one type of memory. For example, the memory 226 may include one or more of SDRAM, ROM, and flash memory. In one or more embodiments, the memory 226 may store pairing information for connecting with a headset, such as the headset 202, and/or an operating system (OS) of the desk phone 222.

In one or more embodiments, the memory 226 stores applications executable by the hardware processor 224, such as a telephony client 227 (i.e., TELEPH_CLIENT). The telephony client 227 may include any application on the desk phone 222 that allows a user of the desk phone 222 to send and receive VoIP communications (e.g., VoIP calls, etc.) using the desk phone 222 as an endpoint. The telephony client 227 may support, for example, one or more of Session Initiation Protocol (SIP), H.323, Media Gateway Control Protocol (MGCP), Real-time Transport Protocol (RTP), Real-time Transport Control Protocol (RTCP), Secure Real-time Transport Protocol (SRTP), Session Description Protocol (SDP), Skinny Client Control Protocol (SCCP), and Inter-Asterisk eXchange (IAX) protocol.

In one or more embodiments, the telephony client 227 may read a headset identifier from a connected headset. For example, the telephony client 227 may read the headset identifier 208 from the headset 202, over the communications interfaces 216 and 232, when the headset 202 and the desk phone 222 are connected. Still yet, the telephony client 227 may send the headset identifier, after being read from the headset, to a remote server, such as, for example, a call control server and/or a device management server. Also, the telephony client 227 may send a desk phone identifier 228 to a remote server, such as, for example, a call control server and/or a device management server.

Referring still to FIG. 2B, the memory 226 stores the headset identifier 228 (i.e., DP_ID). The desk phone identifier 228 includes any unique value stored to the desk phone 222 which may be used to differentiate the desk phone 222 from other desk phones, including desk phones of the same make and/or model. In one or more embodiments, the desk phone identifier 228 may include a serial number of the desk phone 228. In one or more embodiments, the desk phone identifier 228 may include a MAC address of the desk phone 222. To this end, the desk phone identifier 228 may include any software readable device identifier that has been assigned to the desk phone 222. As an option, the desk phone identifier 228 may be stored to a read-only area of the memory 206.

Also, the memory 226 of the desk phone 222 includes configuration data 229 (i.e., CFG_DATA). As described herein, the configuration data 229 includes any rewritable portion of the memory 226 that may be dynamically configured according to a user's configuration profile. The configuration profile may be received from a remote server. In one or more embodiments, the configuration data 229 may include a contact list of a user. In one or more embodiments, the configuration data 229 may include speed dial preferences for a user, which map one or more of the user controls 230 (e.g., key pad buttons, menu options, etc.) to saved phone numbers and/or contacts. In one or more embodiments, the configuration data 229 includes an extension of a user, a mapping to access a voice mailbox of a user, volume preferences of a user, and/or ring preferences of a user.

The user controls 230 include any mechanism of the desk phone 222, mechanical and/or electronic, that responds to user operation. The user controls 230 may include one or more of a button, a switch, a capacitive sensor, a touch screen, etc. The hardware processor 204 may control the transmission of messages to a remote server, via the network interface 234 and/or messages to a headset via the communications interface 232, in response to user operation (e.g., button presses, switches, etc.) of the user controls 230.

Figure 2C:
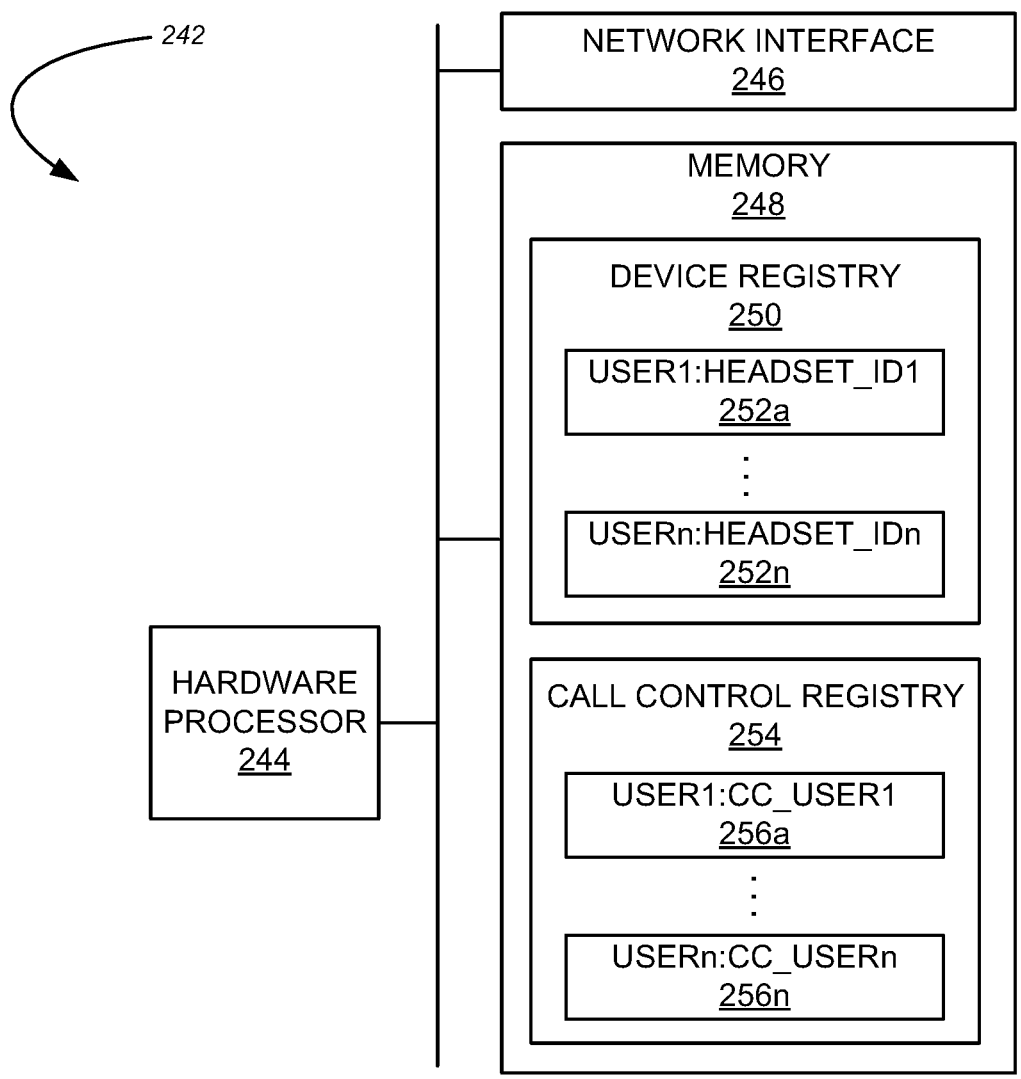

FIG. 2C shows a block diagram of a device management server 242 for extension mobility via a headset connection, according to one embodiment. Although the elements of the device management server 242 are presented in one arrangement, other embodiments may feature other arrangements, and other configurations may be used without departing from the scope of the invention. For example, various elements may be combined to create a single element. As another example, the functionality performed by a single element may be performed by two or more elements. In one or more embodiments of the invention, one or more of the elements shown in FIG. 2C may be omitted, repeated, and/or substituted. Accordingly, various embodiments may lack one or more of the features shown. For this reason, embodiments of the invention should not be considered limited to the specific arrangements of elements shown in FIG. 2C.

As shown in FIG. 2C, the device management server 242 includes a hardware processor 244 operably coupled to a memory 248, and a network interface 246. In one or more embodiments, the hardware processor 244, the memory 248, and the network interface 246 may remain in communication over one or more communications busses. Although not depicted in FIG. 2C for purposes of simplicity and clarity, it is understood that, in one or more embodiments, the device management server 242 may include an output device, such as a display. The device management server 242 may be substantially identical to the device management server 124 described in the context of FIG. 1B, above.

As described herein, the hardware processor 224 processes data, including the execution of applications stored in the memory 248. In one or more embodiments, the hardware processor 244 may include a variety of processors (e.g., digital signal processors, etc.), analog-to-digital converters, digital-to-analog converters, etc., with conventional CPUs being applicable.

As described herein, the memory 248 includes any storage device capable of storing information temporarily or permanently. The memory 248 may include volatile and/or non-volatile memory, and may include more than one type of memory. For example, the memory 248 may include one or more of SDRAM, ROM, and flash memory.

As depicted in FIG. 2C, the memory 248 stores a device registry 250 and a call control registry 254. The device registry 250 includes one or more device mappings 252 (i.e., device mapping 252a-252n). Each of the device mappings 252 associates a user identifier with a headset identifier. For example, a first device mapping 252a associates a first user identifier (i.e., USER1) with the headset identifier of a first headset (i.e., HEADSET_ID1). A user identifier may include any suitable string of symbols (e.g., letters, numbers, etc.) that are attached to a headset user, and which can be retrieved by the device management server 242. For example, the user identifier may include a user's name (e.g., "John Doe," etc.), the user's email address (e.g., "johndoe@plantronics.com," etc.), or the user's username (e.g., "john.doe," etc.). A single user identifier may be associated with multiple headset identifiers in the device registry 250. For example, the user may own 2 or more headsets, where each of the headsets is associated with a different device mapping 252 in the device registry 250.

Further, the call control registry 254 includes one or more call control mappings 256 (i.e., call control mappings 256a-256n). Each of the call control mappings 256 associates a user identifier, as identified in the device registry 250, with a call control user identifier. For example, a first call control mapping 256a associates a first user (i.e., USER1) with a first call control user identifier (i.e., CC_USER1). In one or more embodiments, a call control user identifier may include any suitable string of symbols (e.g., letters, numbers, etc.) that are registered with a call control system, and uniquely identify an account or line on the call control system. For example, a call control user identifier may include a phone number (e.g., "8314265858"), an extension (e.g., "5858"), or other line in a call control system. As another example, a call control user identifier may include a username that is registered with a PBX system, and attached to a phone number or extension.

In one or more embodiments, one or more intermediate associations may be required to map from a headset identifier to a call control user identifier. For example, a headset identifier may be associated with a first value in a device registry, where the first value is a username or other unique value used to search an enterprise directory service. The enterprise directory service may include, for example, one or more of Microsoft's Active Directory services. The search of the enterprise directory service may return a second value that is then used to search the call control registry 254 for a call control user identifier.

In one or more embodiments, when the device management server 242 receives the headset identifier of a given headset, the device management server 242 is operable to locate a user identifier that is associated with the headset identifier in the device registry 250 (i.e., via a device mapping 252). Moreover, after locating the user associated with the headset, the device management server 242 is operable to locate a call control user identifier of the user in the call control registry 254 (i.e., via a call control mapping 256). Accordingly, in response to being presented with a headset identifier, the device management server 242 is operable to identify a call control user identifier that is managed by a call control system, and which is associated with the user that owns the headset. As described herein, the call control user identifier may be returned to a desk phone to which the headset is connected, or to a call control server, so that an extension mobility operation can be initiated.

Figure 3A:
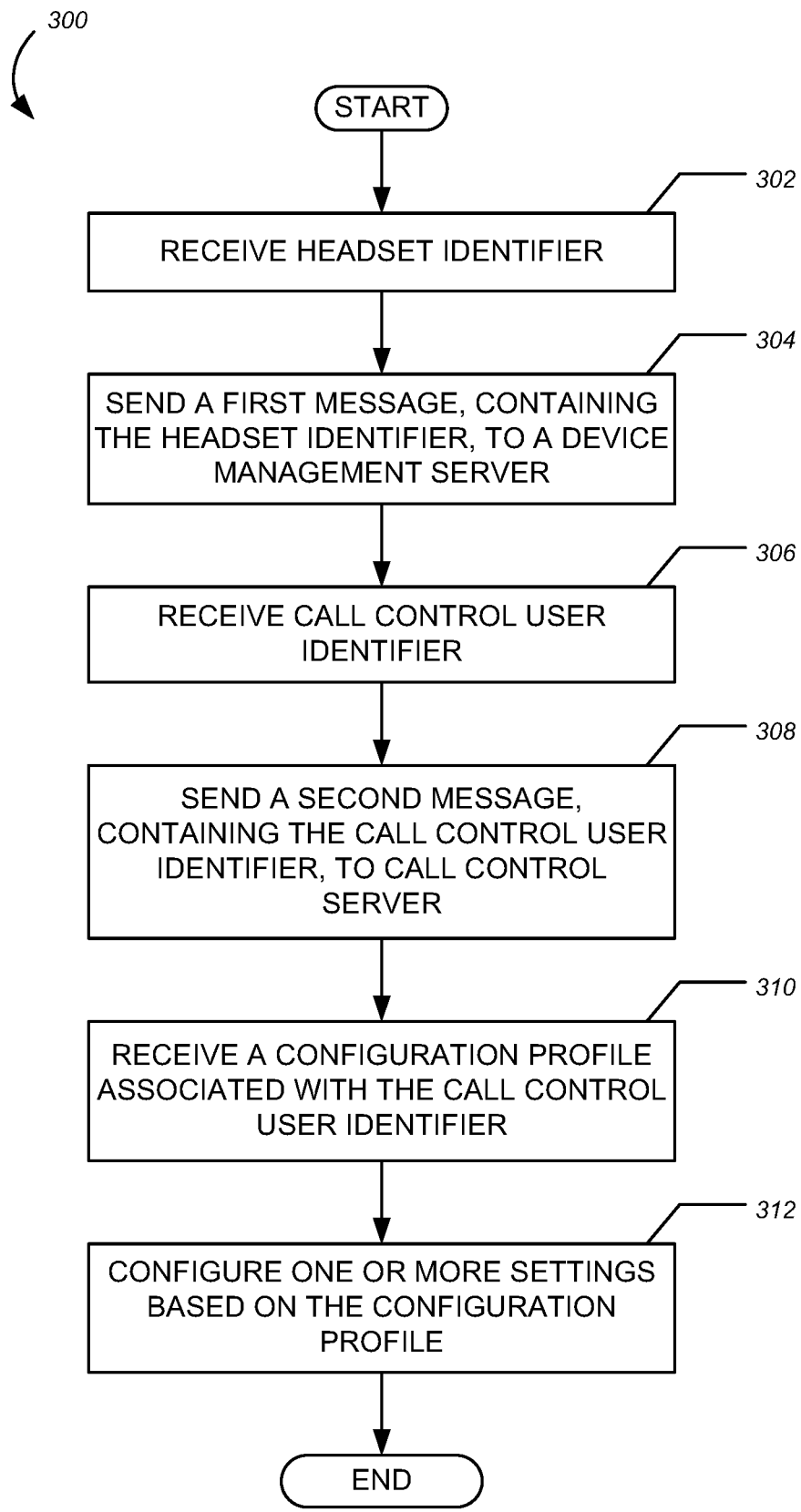
FIGS. 3A and 3B are flow diagrams showing methods for performing extension mobility via a headset connection, in accordance with one or more embodiments of the invention.

FIG. 3A shows a flowchart of a method 300 for extension mobility via a headset connection, in accordance with one or more embodiments of the invention. While the steps of the method 300 are presented and described sequentially, one of ordinary skill in the art will appreciate that some or all of the steps may be executed in a different order, may be combined or omitted, and may be executed in parallel. Furthermore, the steps may be performed actively or passively. For example, some steps may be performed using polling or be interrupt driven in accordance with one or more embodiments of the invention. In one or more embodiments, the method 300 may be carried out by a desk phone, such as a desk phone 104, described above in reference to FIGS. 1A and 1B, or a desk phone 222, described above in reference to FIG. 2B.

At step 302, a headset identifier is received. The headset identifier may be received directly from a headset. For example, the headset identifier may be retrieved from the headset by a desk phone in response to the headset being connected to the desk phone. The headset identifier may be received via a communications interface of the desk phone, to which the headset has been connected. In one or more embodiments, the communications interface includes physical interface, such as, for example a USB interface, and the headset identifier is received over the physical interface. Accordingly, the headset identifier may be retrieved from the headset in response to detecting a physical coupling of the headset with the desk phone. The headset may be queried for its device identifier in response to detecting the physical coupling of the headset with the desk phone. In one or more embodiments, the communications interface includes a wireless link, such as, for example, a Bluetooth, NFC, or Wi-Fi link. Accordingly, the headset identifier may be received from a headset during a pairing process between the headset and a desk phone, when the headset is tapped against the desk phone, when the headset enters into a given proximity of the desk phone, or any another wireless connection process between the headset and the desk phone. For example, the headset may be queried for its headset identifier in response to detecting the proximity of the headset using a near-field communications sensor.

The headset may have been previously registered to a device management server as being used by a specific user or person. Accordingly, when the headset is connected to the desk phone, such connection may represent a physical manifestation of that user's intent to temporarily assume use of the desk phone.

Also, at step 304, the headset identifier is sent in a first message. The first message is sent to a device management server. The first message may be sent via a network interface over any suitable network. As an option, the first message may include additional information, such as, for example, a desk phone identifier of the desk phone from which the first message originates and/or a location of the desk phone from which the first message originates. The location may include, for example, a name of a network to which the desk phone is connected (e.g., Service Set Identifier (SSID), domain, etc.), and/or an address of an access point to which the desk phone is connected. In one or more embodiments, a desk phone may be operable to determine its location using Wi-Fi localization and/or a Global Positioning System (GPS). Also, as an option, the first message may include authentication information, as described below.

At step 306, a call control user identifier is received from the device management server. As noted above, the call control user identifier is a unique key (i.e., string of symbols) registered with a call control system that identifies a single account or line on the call control system.

After receiving the call control user identifier from the device management server, the desk phone sends, at step 308, a second message to a call control server. The second message includes the call control user identifier. The second message may be sent via a network interface over any suitable network. As an option, the second message may include additional information, such as, for example, the desk phone identifier of the desk phone from which the second message originates and/or the location of the desk phone from which the second message originates. Also, as an option, the message may include authentication information, as described below.

At step 310, a configuration profile is received at the desk phone. The configuration profile is associated with the call control user identifier sent in the second message. The configuration profile may be received from the call control server. The configuration profile may include one or more of: line associations, speed dial preferences, do not disturb preferences, a contacts list (i.e., an address book), ring preferences, call forwarding preferences, message indicator preferences, voicemail preferences, phone features, phone services, and web-based settings. At step 312, the desk phone is configured according to the configuration profile received at step 310. In this way, the desk phone may be rapidly configured according to a user's preferences in response to the user simply connecting his or her headset to the desk phone.

In one or more embodiments, the user may be authenticated prior to the configuration, at step 312, of the desk phone utilizing the user's configuration profile. As an option, the user may be authenticated using a Personal Identification Number (PIN). For example, the user may be prompted to enter the PIN into the desk phone after connecting the headset to the desk phone. As a more specific example, the user may be prompted to enter the PIN prior to the desk phone sending the second message to the call control server, such that the PIN can be included as authentication information in the second message. In such an example, the call control server may only return the configuration profile of the user after confirming that the PIN entered by the user matches a PIN stored in association with the configuration profile at the call control server. As another example, the user may be prompted to enter the PIN at the desk phone after the configuration profile has been returned from the call control server. In such an example, the configuration profile may include a PIN that is checked against a PIN entered by the user at the desk phone, and the desk phone is only configured according to the configuration profile when the two PINs match. As an option, the user may be authenticated using a biometric mechanism. For example, the desk phone may include a finger print scanner, or the headset presented by the user to the desk phone may be used to perform voice authentication on the user. For example, the user may speak a predetermined phrase into the headset, which is compared to a stored model, such as a voice print. The comparison may occur at the headset, such that the headset passes confirmation (e.g., binary score, confidence value, etc.), of user authentication to the desk phone, which may forward the confirmation on to the device management server and/or the call control server; or the user's speech may be recorded and passed on to the device management server and/or the call control server, either of which may compare the voice recording to a stored model. If the device management server and/or the call control server is unable to authenticate the user, then the servers may not return the call control user identifier and/or the configuration profile to the desk phone.

Figure 3B:
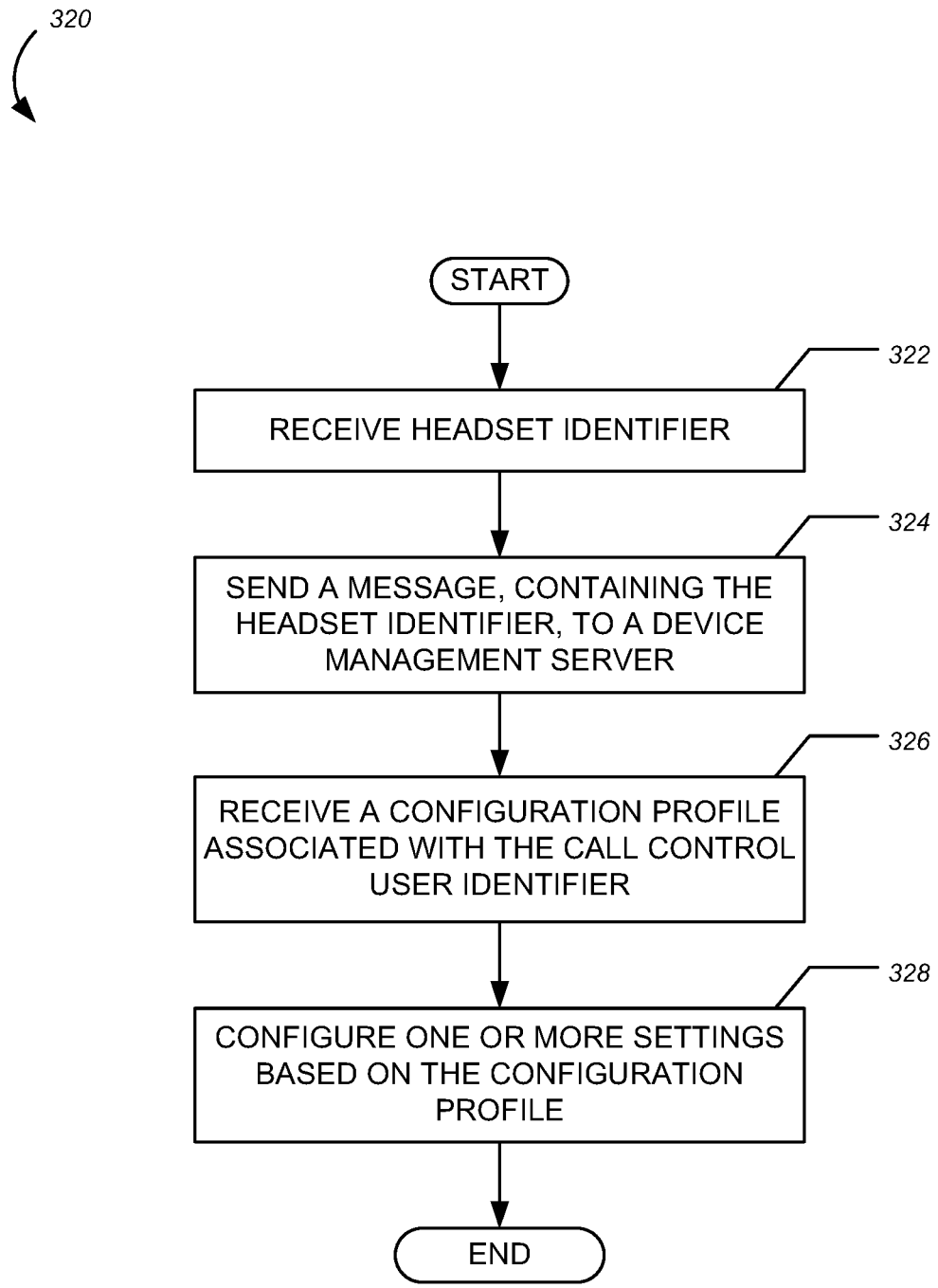

FIG. 3B shows a flowchart of a method 320 for extension mobility via a headset connection, in accordance with one or more embodiments of the invention. While the steps of the method 320 are presented and described sequentially, one of ordinary skill in the art will appreciate that some or all of the steps may be executed in a different order, may be combined or omitted, and may be executed in parallel. Furthermore, the steps may be performed actively or passively. For example, some steps may be performed using polling or be interrupt driven in accordance with one or more embodiments of the invention. In one or more embodiments, the method 320 may be carried out by a desk phone, such as a desk phone 104, described above in reference to FIGS. 1A and 1B, or a desk phone 222, described above in reference to FIG. 2B.

At step 322, a headset identifier is received. The execution of step 322 may proceed substantially the same as step 302, described above in the context of FIG. 3A. Further, at step 324, the headset identifier is sent in a message. The message is sent to a device management server. The execution of step 324 may proceed substantially the same as step 304, described above in the context of FIG. 3A. At step 326, a configuration profile is received at the desk phone.

The configuration profile may be received from the device management server to which the first message containing the headset identifier was sent, or from a call control server. For example, the device management server may, upon receiving the message from the desk phone, look up a call control user identifier using the headset identifier in the message. Further, the device management server may pass the call control user identifier directly to a call control server. For example, the device management server may pass the call control user identifier to the call control server using an extension mobility API of the call control server. Upon receiving the call control user identifier, the call control server may identify a configuration profile associated with the call control user identifier. The call control server may return the configuration profile directly to the desk phone, or the call control server may send the configuration profile to the device management server. If the call control server sends the configuration profile to the device management server, the device management server may then forward the configuration profile back to the desk phone from which the message originated.

Accordingly, in one or more embodiments, the message sent at step 324 may contain information pertaining to the desk phone from which the message originates. For example, the message may include a desk phone identifier associated with the desk phone, a network address, or a location of the desk phone. Using this information, a call control server may be able to directly return the configuration profile to the desk phone. Also, using this information, the call control server may be able to first determine whether the desk phone is registered for extension mobility operations. The configuration profile may be returned to the desk phone at step 326 only after the call control server confirms, using the desk phone information, that the desk phone is permitted to perform extension mobility operations.

Additionally, at step 328, the desk phone is configured according to the configuration profile received at step 326. In this way, the desk phone may be rapidly configured according to a user's preferences in response to the user simply connecting his or her headset to the desk phone. In one or more embodiments, the user may be authenticated prior to the configuration of the desk phone utilizing the user's configuration profile. The user authentication may proceed as described above, in reference to FIG. 3A.

Figure 4:
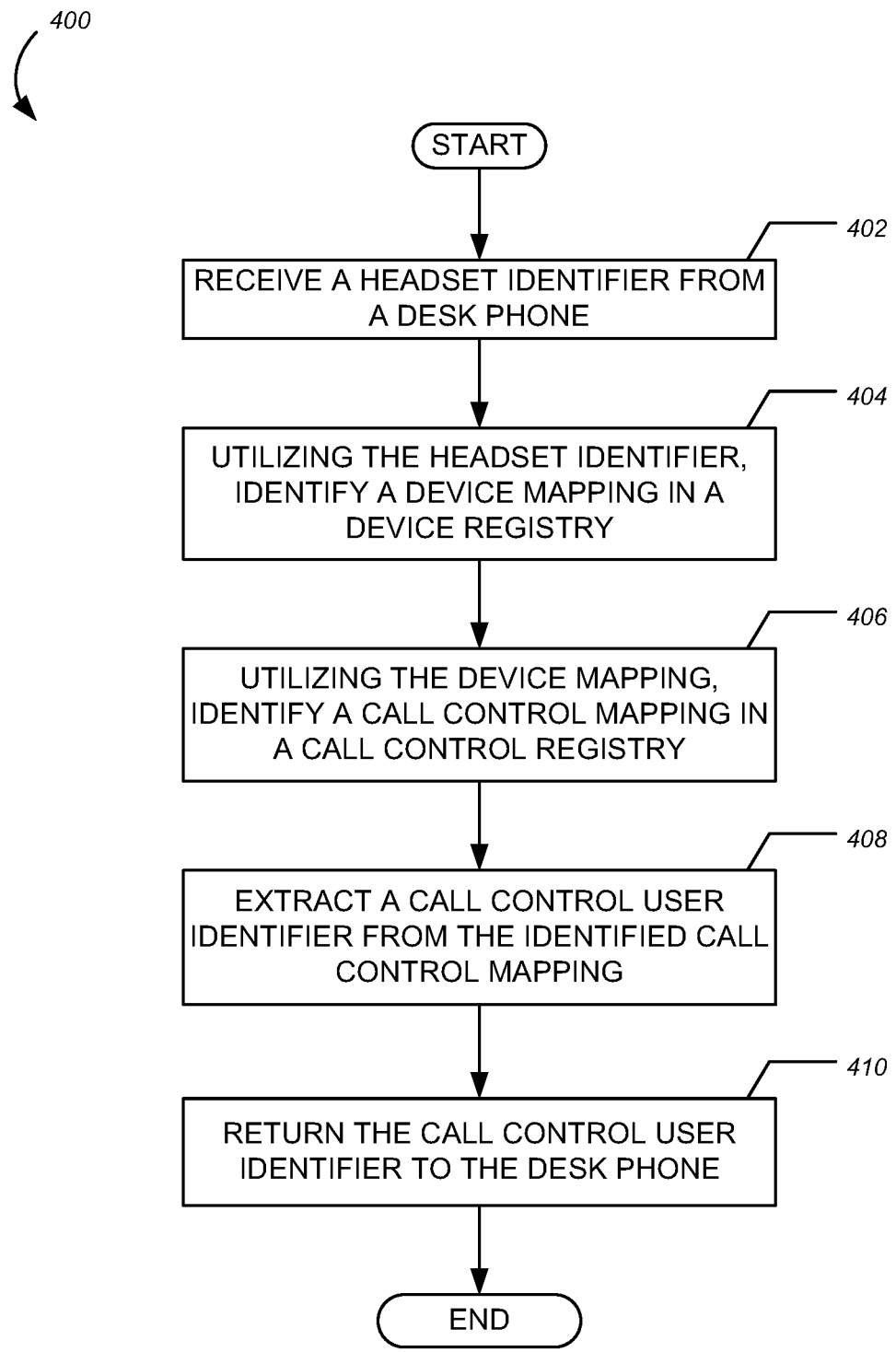
FIG. 4 is a flow diagram showing a method for performing extension mobility via a headset connection, in accordance with one or more embodiments of the invention.

FIG. 4 shows a flowchart of a method 400 for extension mobility via a headset connection, in accordance with one or more embodiments of the invention. While the steps of the method 400 are presented and described sequentially, one of ordinary skill in the art will appreciate that some or all of the steps may be executed in a different order, may be combined or omitted, and may be executed in parallel. Furthermore, the steps may be performed actively or passively. For example, some steps may be performed using polling or be interrupt driven in accordance with one or more embodiments of the invention. In one or more embodiments, the method 400 may be carried out by a device management server, such as the device management server 124, described above in reference to FIG. 1B, or the device management server 242, described above in reference to FIG. 2C.

At step 402, a headset identifier is received from a desk phone. The headset identifier may be received in a message sent from the desk phone over a network. Accordingly, the headset identifier may be received via a network interface of the device management server. In one or more embodiments, the message may include additional information, such as, for example, a desk phone identifier of the desk phone from which the message originated and/or a location of the desk phone from which the message originated.

Next, at step 404, a device mapping is identified, from within a device registry, utilizing the headset identifier. The device registry may include a plurality of device mappings, where each device mapping includes a user identifier associated with a headset identifier. Accordingly, the device management server may search the device registry for the headset identifier received in the message to identify the device mapping. Further, at step 406, and utilizing the device mapping identified at step 404, a call control mapping within a call control registry is identified.

In one or more embodiments, the user identifier in the device mapping identified at step 404 may be used to search an enterprise directory service. The enterprise directory service may include, for example, one or more of Microsoft's Active Directory services. The search of the enterprise directory service may return another identifier, such as an employee identification number or username, which may be used to search the call control registry. In one or more embodiments, the user identifier in the device mapping identified at step 404 may be used to search the call control registry. The call control registry may include a plurality of call control mappings, where each call control mapping includes a user identifier associated with a call control user identifier. The user identifier of a given call control mapping may be paired to a headset identifier in the device registry. The call control user identifier of the call control mapping may be used by a call control server to administer line associations, manage calls, etc. for a user. Thus, based on the headset identifier received at step 402, a device mapping including the headset identifier is identified at step 404, where the device mapping also includes a user identifier, and a call control mapping that includes the user identifier may be identified at step 406.

Further, at step 408, the call control user identifier is extracted from the call control mapping identified at step 406. Also, the call control user identifier is returned, at step 410, to the desk phone. Upon receiving the call control user identifier, the desk phone may then initiate an extension mobility operation by directly communicating with an extension mobility service of a call control server, as described above in reference to FIG. 3A. The extension mobility operation may be initiated by the desk phone using an extension mobility API of the call control server.

It is contemplated that, in one or more embodiments, the device management server may initiate the extension mobility operation by sending an extension mobility command, including the extracted call control user identifier, to the call control server. The extension mobility command, sent from the device management server to the call control server, may include a network address of the desk phone and/or other unique identifier that is associated with the desk phone (e.g., a desk phone identifier, etc.). In response, the call control server may communicate a configuration profile to the desk phone from which the headset identifier was received, and complete the extension mobility operation. This may occur, for example, in systems where the device management server and the call control server have been integrated.

Figure 5:
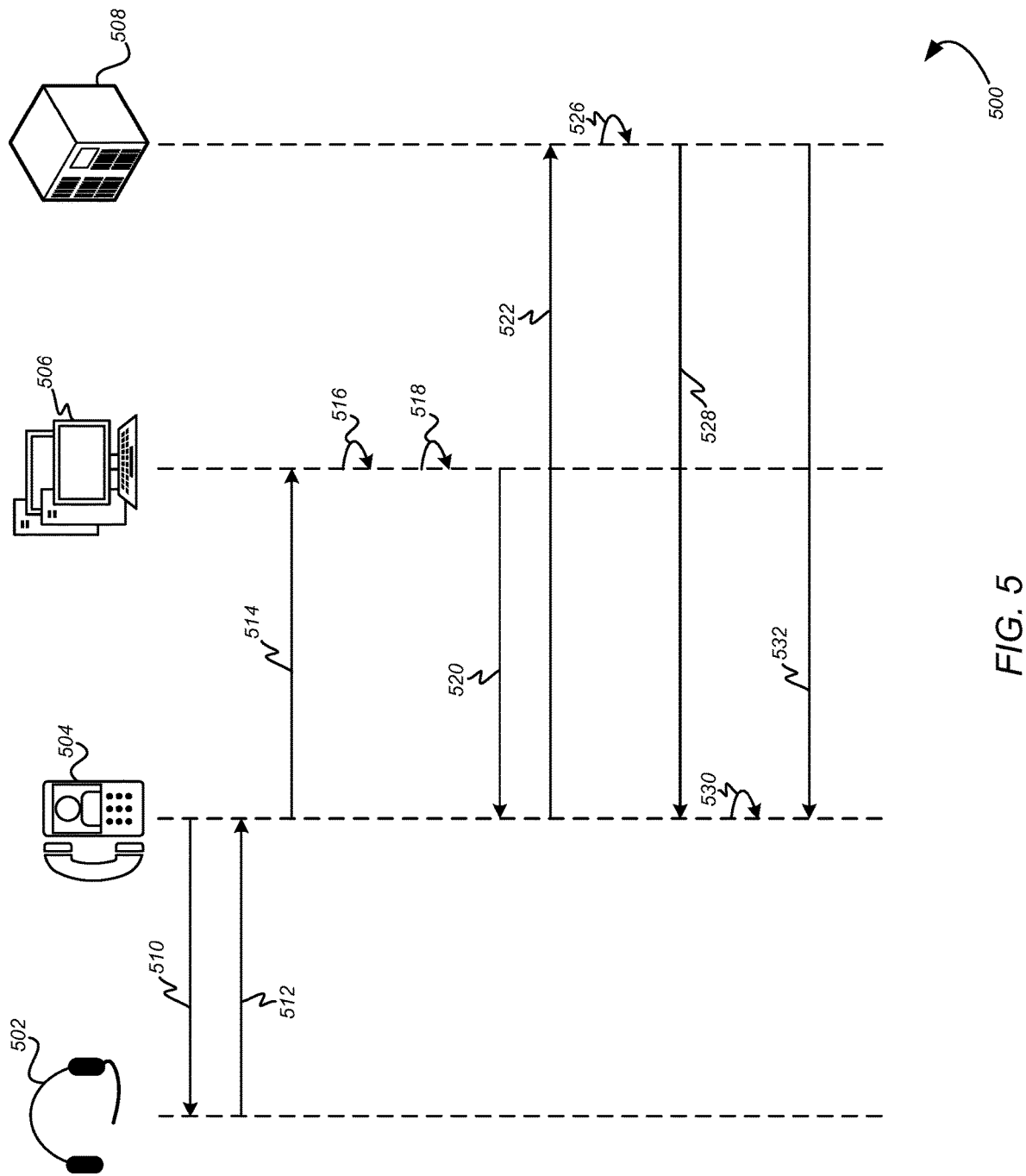
FIG. 5 is a diagram depicting a communication flow for extension mobility via a headset connection, in accordance with one or more embodiments of the invention.

Referring to FIG. 5, a communication flow 500 for extension mobility via a headset connection is shown in accordance with one or more embodiments of the invention. As depicted in FIG. 5, the communication flow 500 proceeds between a headset 502, a desk phone 504, a device management server 506, and a call control server 508. The headset 502 may be substantially identical the headset 108, described above in reference to FIGS. 1A-1B, or the headset 202, described above in reference to FIG. 2A. The desk phone 504 may be substantially identical the desk phone 104, described above in reference to FIGS. 1A-1B, or the desk phone 222, described above in reference to FIG. 2B. The device management server 506 may be substantially identical the device management server 124, described above in reference to FIG. 1B, or the device management server 242, described above in reference to FIG. 2C. The call control server 508 may be substantially identical the call control server 122, described above in reference to FIG. 1B.

At operation 510, the desk phone 504 queries the headset 502 for its headset identifier. As an option, the desk phone 504 may query the headset 502 in response to detecting that the headset 502 has been physically connected to the desk phone 504, or during the formation of a wireless link between the headset 502 and the desk phone 504. At operation 512, the headset responds to the query, and provides its headset identifier. Next, at operation 514, the desk phone 504 generates and sends a message to the device management server 506. The message to the device management server includes the headset identifier presented by the headset 502. In this way, the desk phone 504 informs the device management server 506 that the headset 502 has been connected to the desk phone 504. The message to the device management server may include additional information, such as a unique identifier associated with the desk phone 504 and/or location information of the desk phone 504.

In response to receiving the message from the desk phone 504, the device management server 506, at operation 516, searches its device registry for a device mapping that includes the headset identifier. The identified device mapping includes a user identifier associated with the headset identifier of the headset 502. Next, at operation 518, the device management server 506 searches its call control registry for a call control mapping that includes the user identifier in the device mapping previously identified at operation 516. The call control mapping identified at operation 518 includes a call control user identifier. The call control user identifier may include a phone number, extension, or user name of the person that connected the headset 502 to the desk phone 504. Accordingly, at operation 520, the call control user identifier is returned to the desk phone 504.

Still yet, at operation 522, the desk phone 504 initiates an extension mobility operation by sending a message to the call control server 508, where the message includes the call control user identifier returned from the device management server 506. The message to the call control server 508 may also include one or more of the headset identifier of the headset 502, a desk phone identifier of the desk phone 504, location information of the desk phone 504, and authentication information of the user of the headset 502. Using the contents of the message received from the desk phone 504 at operation 522, the call control server 508 determines, at operation 526, whether to permit the extension mobility operation. The call control server 508 may determine, for example, whether the user of the headset 502 has been authenticated, whether the desk phone 504 is permitted to perform extension mobility, whether the call control user identifier received at operation 522 is valid, etc. Upon determining that the extension mobility operation is permitted, the call control server 508 returns, at operation 528, a configuration profile to the desk phone 504. At operation 530, the desk phone 504 configures itself according to the configuration profile. At this point, the desk phone 504 has been configured for the user that connected the headset 502 to the desk phone 504. This may include attaching the user's line or extension to the desk phone 504, as well as configuring the desk phone 504 based on the preferences of the user.

Accordingly, when an incoming call to the user's extension is received at the call control server 508, the call control server 508 rings the desk phone 504 at operation 532. The desk phone 504 may alert the user of the incoming call according to his or her preferences in the configuration profile. If the call is answered by the user, call audio for the call may be sent and received using the microphone and speaker(s) of the headset 502, obviating the need to use a handset at the desk phone 504. In one or more embodiments, the headset 502 may connect directly to a network, such that it may communicate directly with the call control server 508, without relying on the desk phone 504. In such embodiments, the headset 502 may still rely on the desk phone 504 to register its presence and/or to initiate outgoing VoIP calls. For example, the user of the headset 502 may push a speed dial button on the desk phone 504. In turn, the desk phone 504 may instruct the headset 502 or the call control server 508 to open a new VoIP session between the headset 502 and a phone number mapped to the speed dial button. Accordingly, in such embodiments, both the headset 502 and the desk phone 504 may be different line pair instances of the same phone number or extension of a call control user.

Described hereinabove are systems and methods for performing extension mobility via a headset connection. As companies trend towards having a greater number of employees that primarily work remotely, these companies are increasingly reliant on shared workspaces for providing hot desking or hoteling functionality. The systems and methods described herein obviate difficulties that such employees face when attaching their lines to desk phones installed in shared workspaces. In particular, the systems and methods described herein rely on the prior registration of a headset to a user in order to facilitate the streamlined attachment of the user's line and call preferences to a desk phone. By performing extension mobility via a headset connection, users are able to move freely across a company's campus, or between its campuses, and remain confident that they will not miss a call. Such functionality may be extended to desk phones that are not reserved entirely for hot desking or hoteling users. For example, where the desk phone configured for extension mobility via a headset connection is a conference room-based speakerphone, a user may quickly move his or her extension to a conference room-based speakerphone in order to receive and make calls.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM,

EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits). As used herein, the term "module" may refer to any of the above implementations.

A number of implementations have been described. Nevertheless, various modifications may be made without departing from the scope of the disclosure. Accordingly, other implementations are within the scope of the following claims.

What is claimed is:

1. A non-transitory computer-readable media embodying instructions executable by a processor to perform functions comprising:
   receiving a headset identifier from a headset;
   in response to receiving the headset identifier, sending, to a device management server, a first message including the headset identifier;
   receiving, from the device management server, a call control user identifier;
   sending, to a call control server, a second message including the call control user identifier;
   receiving, from the call control server, a configuration profile associated with the call control user identifier, wherein the configuration profile includes one or more of line associations, speed dial preferences, do not disturb preferences, a contacts list, ring preferences, call forwarding preferences, message indicator preferences, and voicemail preferences; and
   configuring one or more settings of a desk phone based on the configuration profile.

2. The non-transitory computer-readable media of claim 1, the functions comprising:
   detecting a physical connection of the headset;
   in response to detecting the physical connection of the headset, querying, over the physical connection, the headset for the headset identifier, wherein the headset identifier is received in response to querying the headset.

3. The non-transitory computer-readable media of claim 1, wherein the headset identifier is received from the headset over a wireless link.

4. The non-transitory computer-readable media of claim 1, the functions comprising:
   detecting a proximity of the headset using a near-field communications sensor;
   in response to detecting the proximity of the headset, querying, over a wireless link, the headset for the headset identifier, wherein the headset identifier is received in response to querying the headset.

5. The non-transitory computer-readable media of claim 1, wherein at least one of the first message and the second message includes a desk phone identifier of the desk phone.

6. The non-transitory computer-readable media of claim 1, wherein at least one of the first message and the second message includes location information of the desk phone.

7. The non-transitory computer-readable media of claim 1, the functions comprising, prior to configuring the one or more settings, authenticating a user of the headset.

8. A non-transitory computer-readable media embodying instructions executable by a processor to perform functions comprising:
   receiving a headset identifier from a headset;
   in response to receiving the headset identifier, sending, to a device management server, a message including the headset identifier;
   receiving a configuration profile associated with the headset identifier, wherein the configuration profile includes one or more of line associations, speed dial preferences, do not disturb preferences, a contacts list, ring preferences, call forwarding preferences, message indicator preferences, and voicemail preferences; and
   configuring one or more settings of a desk phone based on the configuration profile.

9. The non-transitory computer-readable media of claim 8, the functions comprising:
   detecting a physical connection of the headset;
   in response to detecting the physical connection of the headset, querying, over the physical connection, the headset for the headset identifier, wherein the headset identifier is received in response to querying the headset.

10. The non-transitory computer-readable media of claim 8, wherein the headset identifier is received from the headset over a wireless link.

11. The non-transitory computer-readable media of claim 8, the functions comprising:
   detecting a proximity of the headset using a near-field communications sensor;
   in response to detecting the proximity of the headset, querying, over a wireless link, the headset for the headset identifier, wherein the headset identifier is received in response to querying the headset.

12. The non-transitory computer-readable media of claim 8, wherein the message includes a desk phone identifier of the desk phone.

13. The non-transitory computer-readable media of claim 8, wherein the message includes location information of the desk phone.

14. The non-transitory computer-readable media of claim 8, the functions comprising, prior to configuring the one or more settings, authenticating a user of the headset.

* * * * *